United States Patent [19]

Kwap et al.

[11] 4,079,408

[45] Mar. 14, 1978

[54] SEMICONDUCTOR STRUCTURE WITH ANNULAR COLLECTOR/SUBCOLLECTOR REGION

[75] Inventors: Theodore William Kwap, Brewster; Ingrid Emese Magdo, Hopewell Junction, both of N.Y.

[73] Assignee: International Business Machines Corporation, Armonk, N.Y.

[21] Appl. No.: 645,760

[22] Filed: Dec. 31, 1975

[51] Int. Cl.² .......................................... H01L 27/04
[52] U.S. Cl. ...................................... 357/50; 357/15;
357/20; 357/36; 307/299 A; 307/317 A
[58] Field of Search ................ 357/36, 20, 15, 48,
357/50; 307/317 A, 299 A

[56] References Cited

U.S. PATENT DOCUMENTS

| | | | |
|---|---|---|---|
| 3,229,119 | 1/1966 | Bohn et al. .......................... 357/48 |
| 3,482,111 | 12/1969 | Gunderson et al. ................. 357/44 |
| 3,510,736 | 5/1970 | Dingwall ............................ 357/34 |
| 3,622,842 | 11/1971 | Oberal ............................... 357/48 |
| 3,648,125 | 3/1972 | Peltzer .............................. 357/50 |
| 3,774,088 | 11/1973 | Magdo et al. ...................... 357/50 |
| 3,909,837 | 9/1975 | Kronlage ........................... 357/15 |
| 3,916,431 | 10/1975 | Khajezadeh ....................... 357/89 |

OTHER PUBLICATIONS

Hibberd, R. G., Integrated Circuits, McGraw-Hill, N.Y., 1969, pp. 109-110.

*Primary Examiner*—William D. Larkins
*Assistant Examiner*—Marcus S. Rasco
*Attorney, Agent, or Firm*—Theodore E. Galanthay

[57] ABSTRACT

Disclosed is a semiconductor structure with an annular collector/subcollector region. The base area with the emitter, is positioned over the collector/subcollector region only, resulting in a smaller base to collector capacitance. Packing density is improved and circuit design flexibility is provided by the ability to change the emitter size without changing the size of the overall structure.

21 Claims, 5 Drawing Figures

SEMICONDUCTOR STRUCTURE WITH ANNULAR COLLECTOR/SUBCOLLECTOR REGION

BACKGROUND OF THE INVENTION

1. Field of the Invention

This invention relates to semiconductor structures and more particularly to an integrated semiconductor transistor structure having an annular collector/subcollector region.

2. Description of the Prior Art

Integrated semiconductor transistor structures are well known in the art. Traditionally, a highly doped $n+$ subcollector region is diffused into a major surface of semiconductor substrate. An epitaxial layer is then deposited over the substrate and the subcollector partially out-diffuses into the epitaxial layer. A base region is then diffused into the epitaxial region with a $p$ type impurity. An $n$ type impurity such as arsenic or phosphorous, for example, is then diffused into the base region forming the emitter region of the transistor.

With the foregoing structure, it is known that transistor action takes places primarily in the area under the emitter region. Thus, a large area between the base and collector/subcollector region as well as between the collector/subcollector region and the substrate do not contribute to the transistor action while adding capacitance, which is undesirable.

It is also known that the size of the emitter diffusion effects the threshold base to emitter voltage ($V_{be}$) of a transistor. A transistor with a smaller emitter can switch from conduction to nonconduction and vice versa faster but has the disadvantage of reduced noise tolerance. In the formation of transistor structures as presently known, the space required by a transistor is changed in order to obtain different $V_{be}$ characteristics.

SUMMARY OF THE INVENTION

In accordance with the present invention, a transistor structure is provided with an annular shaped collector/subcollector region. The terms "collector" and "subcollector" are used interchangeably in the present application. In the process of manufacturing the present semiconductor structure, an annular subcollector is formed into the semiconductor substrate. This subcollector dopant outdiffuses into a subsequently deposited epitaxial layer. Base region(s) are then formed into the epitaxial layer of a conductivity type opposite that of the conductivity type of the subcollector. This results in a PN junction between the base region and the outdiffused subcollector impurities forming the collector of the transistor. Thus, the collector and subcollector regions result from the original impurities introduced into the substrate to form the annular subcollector and since they are a single continuous region formed from the same conductivity type; they might generically be referred to as a collector/subcollector region.

The emitter(s) are formed by introducing an impurity of the same conductivity type as the subcollector region into the base region(s). A plurality of base regions may be formed into the epitaxial layer and isolated from each other with recessed silicon oxide formed by in situ conversion of the epitaxial silicon material. Subsequent emitters formed into the plurality of base regions result in transistors having a multiemitter structure which have been found highly desirable in various circuit applications. With the annular collector region of the present invention, it has also been found convenient to form a Schottky barrier diode into the center of the structure. A plurality of such multiemitter transistors are usually formed into a single semiconductor substrate and isolated from each other by recessed oxide with a possibility of doped isolation under the recessed oxide.

The resultant structure has the advantage of occupying a smaller space for a multiemitter transistor resulting in higher packing density which is particularly essential in the case of large scale integration. The undesirable parasitic capacitances from collector to base and collector to isolation are substantially reduced with the annular collector/subcollector structure. A further and very significant advantage of the present invention is the ability to vary the size of the emitter of any one of the multiemitter transistors without changing the overall size of the transistor thereby not affecting the remainder of the circuitry on any one monocrystalline substrate.

Accordingly, it is an object of this invention to provide an improved semiconductor structure with the flexibility of altering the size of transistor emitters without affecting the overall size of the transistor;

It is another object of this invention to reduce the space required for a multiemitter transistor thereby increasing the number of such transistors that may be placed on a single monocrystalline substrate;

It is still another object of this invention to reduce parasitic capacitance between the collector and base of a transistor structure;

It is still a further object of this invention to reduce the capacitance between the collector and the substrate:

Lastly, it is an object of this invention to provide an opportunity for central placement of a Schottky barrier diode.

The foregoing and other objects, features, and advantages of the invention will be apparent from the following more particular description of a preferred embodiment of the invention as illustrated in the accompanying drawings.

IN THE DRAWINGS

DESCRIPTION OF THE PREFERRED EMBODIMENT

Figure 1:
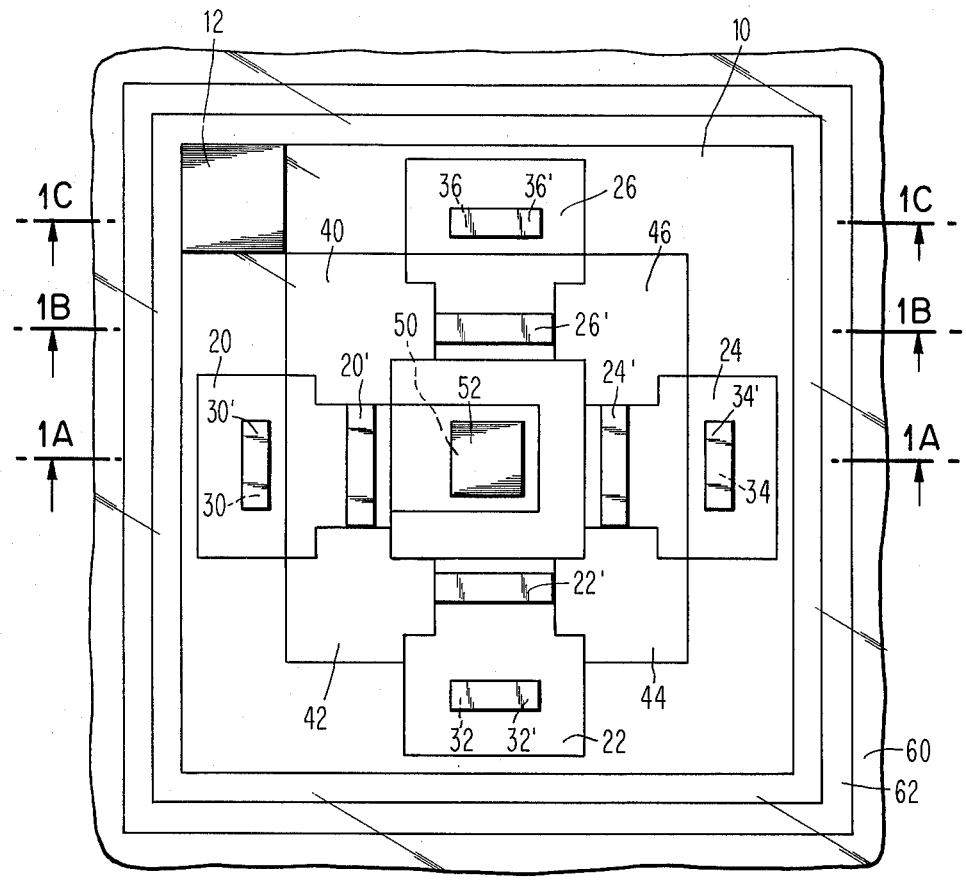
FIG. 1 is a top view of the semiconductor structure of the present invention.

Refer now to FIG. 1 for a description of the top view of the present invention. Note that the view has been drawn partially "transparent" in order to describe buried regions. The annular collector region 10 forms a common collector region for all the devices within the illustrated transistor structure. Collector region 10 is normally buried within the device and is contacted by a reach-through connection and collector contact 12. The illustrated embodiment shows annular collector region 10 in the shape of a rectangle with four base diffusions 20, 22, 24, and 26. Each of the base regions is contacted respectively by base contact 20', 22', 24', and 26'.

Within each base region and formed at least partially over the annular collector region 10 are the emitter regions 30, 32, 34, and 36. Within each emitter region, there is formed an emitter contact designated as 30', 32', 34' and 36'. The base regions are isolated from each other normally by oxide isolation. Thus, base region 20 is isolated from base region 26 by oxide layer 40. Similarly, oxide layers 42, 44, and 46 isolate the other base regions from each other.

The center of the illustrated structure is uniquely adapted for the formation of a Schottky barrier diode, if desired. When the annular collector region 10 is formed, its desired impurity concentration is in the order of $10^{20}$. Collector region 10 normally surrounds a semiconductor region having a much lower impurity concentration in the order of $2 \times 10^{16}$, designated by reference numeral 50 in FIG. 1. It is well known that a metal region 52 formed over an N type region with a low impurity concentration will form a Schottky barrier diode.

As has been previously emphasized, a salient feature of the present invention is the high packing density which means that a large number of structures of the type illustrated in FIG. 1 may be formed into a single monocrystalline semiconductor surface. In order to isolate these structures from each other, a further oxide isolation region 60 is provided. As will be more apparent in the description of the following drawings, it has been found advantageous to place a diffused region 62 under said isolation region 60.

Figure 1A:
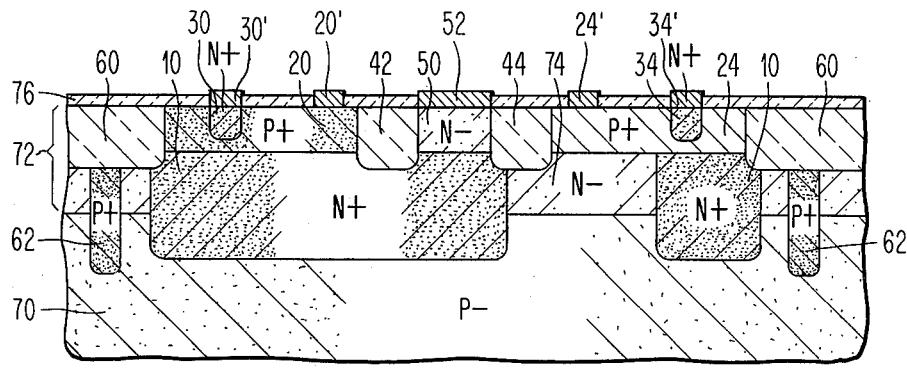
FIG. 1A is a cross sectional view of the semiconductor structure of the present invention along section line 1A.

With continued reference to FIG. 1, also refer to FIG. 1A which is a cross sectional view of the invention along section line 1A. For purposes of illustration, a silicon substrate 70 having a P− type impurity concentration is chosen by way of example to describe the preferred embodiment. The subcollector/collector region 10 is formed into said P− substrate by any one of a number of known techniques such as diffusion or ion implantation. An exemplary N type impurity suitable for this purpose is arsenic which is diffused or implanted to a concentration in the order of $10^{20}$. Note that the annular region 10 does not have to be of uniform cross section throughout, but rather, forms a continuous region to the Schottky diode. Note also that the terms subcollector and collector may be used interchangeably for the purpose of the present invention as they form a continuous semiconductor area of the same impurity type distinguishable only by varying impurity concentration levels.

Also formed into substrate 70 is the P+ isolation ring 62. Subsequently, an epitaxial layer 72 forming an extension of the monocrystalline substrate 70 is deposited. The annular subcollector 10 and the annular isolation region 62 both out-diffuse into the epitaxial layer as illustrated. During out-diffusion the impurity concentration decreases so that the upper surface of the N+ region 10, for example, reaches a concentration level in the order of 2 to $3 \times 10^{16}$ which is no longer N+. Also note that the epitaxially deposited layer not intentional doped otherwise is doped N−, as the region 74.

By the usual photolithographic techniques employed in the manufacture of semiconductors, base regions 20 and 24 are formed of a P+ type impurity type concentration. Base region 20 is contacted by contact 20' while base region 24 is contacted by contact 24'. Emitter region 30 is then formed into base region 20 while emitter region 34 is formed into base region 24.

Emitter region 30 is contacted by contact 30' while emitter region 34 is contacted by contact 34'. The illustrated reference numerals are intended to coincide with the other drawings insofar as practical.

Isolation between the various base regions is provided by recessed oxide layers 42 and 44, for example. Isolation between the various structures is provided by a recessed oxide region 60. The isolation provided by recessed oxide region(s) 60 as well as the doped isolation region 62 are described in greater detail in Peltzer U.S. Pat. No. 3,648,125 as well as Magdo et al U.S. patent application Ser. No. 150,609 filed on June 7, 1971. Specifically, the recessed oxide regions are formed by etching away a portion of the epitaxial layer and then thermally oxidizing the exposed silicon material providing in situ conversion of the epitaxial silicon material into silicon oxide.

As has been previously mentioned, the out-diffusion of annular region 10 results in decreasing impurity concentrations such that region 50 near the top surface of the structure has an impurity concentration in the order of $2 \times 10^{16}$ which is properly designateable as N or N−. Thus, the formation of a metallic contact 52 results in a Schottky barrier diode. Metals for contact 52 such as platinum silicide, for example, are well known for the formation of Schottky barrier diodes in conjunction with N− type semiconductor material. Lastly, a thin layer of oxide 76 is shown covering the structure.

Figure 1B:
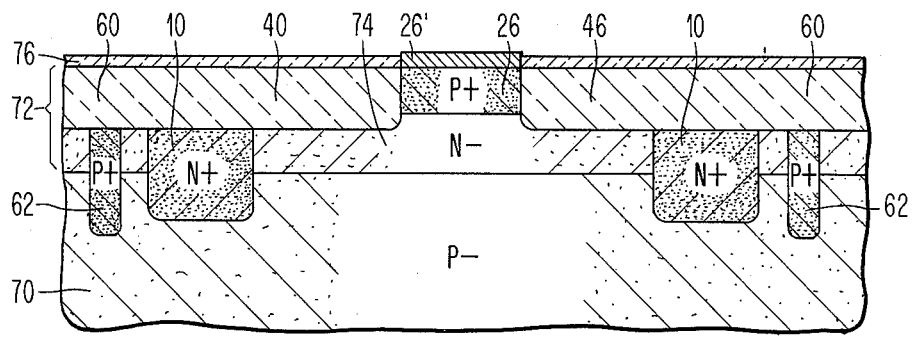
FIG. 1B is a cross sectional view of the semiconductor structure of the present invention along section line 1B.

Refer now to FIG. 1B which is a section along line 1B of FIG. 1. Corresponding portions of the structure have again been described with corresponding reference numerals insofar as practical. Note that annular region 10 is of uniform cross section as no doped extension is provided for the prospective formation of a Schottky barrier diode as was true in FIG. 1A. Annular doped isolation region 62 is shown in the same place, again with an impurity concentration sufficient to prevent inversion at the interface with the recessed oxide. The recessed oxide regions which were previously separate are merged in this cross section so that regions 40 and 46 become the same oxide region for all practical purposes.

Figure 1C:
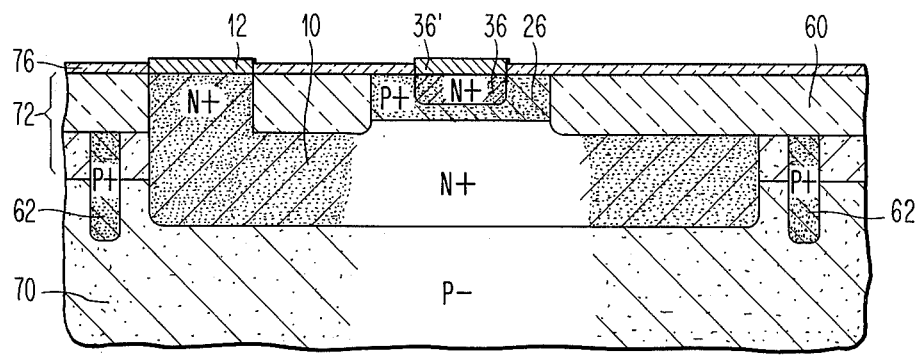
FIG. 1C is a cross sectional view of the present invention along section line 1C.

With continued reference to the previously described figures, refer also to FIG. 1C which illustrates the cross section along section line 1C. FIG. 1C more particularly illustrates the reach-through connection 12. One known technique for contacting a subcollector region 10 (and thereby contacting the collector of a transistor), is by providing a reach through diffusion also of the N+ impurity type and then applying a metallic contact thereto. Those skilled in the art might well be aware of other techniques since the contacting of a subcollector by means of a contact such as illustrated by reference 12 is known.

Figure 2:
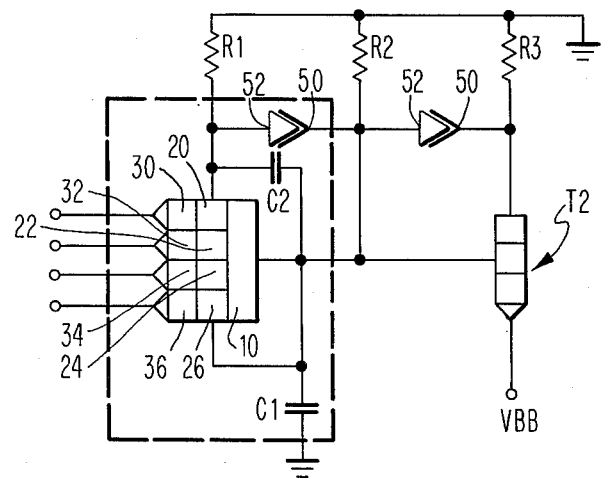
FIG. 2 is a circuit diagram of the type in which the semiconductor structure of the present invention could be utilized.

Refer now to FIG. 2 which shows a circuit of the type in which the present structure would be useful. The present structure is generally designated by the area within dashed lines. Reference numerals have again been maintained consistent insofar as practical. The multiemitter transistor has a common collector region 10, four emitter regions, and four base regions, arbitrarily numbered to generally coincide with previously utilized reference numerals. The metallic contact 52 of the Schottky diode is illustrated as connected to base 20 while the cathode 50 is connected to collector 10 as is readily seen also by reference to FIG. 1A. The additional Schottky diode S2 and the additional transistor T2 as well as resistors R1, R2, and R3 are merely exemplary of the overall useful circuit arrangement. Those skilled in the art will recognize that the circuit is of the type designated as transistor-transistor logic (TTL). A very real (although undesired) portion of the circuit of FIG. 2 is a capacitance between the collector and base (C2) as well as between the collector and substrate (C1). The base to collector capacitance is a function of the common area between the base and collector regions. By reducing the common area between base and collector, the undesired collector to base capacitance is reduced. By reference to the previous drawings, and particularly FIG. 1B, for example, it is seen that the common area between base and collector has been substantially reduced by the annular collector concept, particularly in those areas of the base which are not covered by an emitter and therefore serves no useful purpose in the transistor action. The collector to substrate area is similarly reduced, thereby also reducing the parasitic capacitance C1.

As was also previously pointed out, the characteristics of all transistors including the illustrated multiemitter transistor, are significantly effected by the size of the emitter. Particularly, $V_{BE}$ and noise tolerances vary greatly with emitter size. These characteristics of a transistor are difficult to determine theoretically in advance of actual manufacture because of the many variables inevitable in semiconductor processing steps. Thus, frequently the need to change the size of an emitter does not arise until after a complete experimental circuit has been fabricated. It is, of course, well known that such complex circuits on a single semiconductor substrate are fabricated in accordance with strict interrelated processes and wiring rules. In the prior art, the need to change the characteristics of a single transistor would require changing the size of its emitter, in turn changing the size of the transistor, thereby requiring a redesign in the layout of the entire arrangement. By the present invention, the emitter of a transistor such as emitters 30, 32, 34, and 36 can be altered in size without changing the area occupied by the illustrated transistor structure, thereby not requiring the redesign of the entire integrated circuit.

What has been described is an improved semiconductor structure that will fit a multiemitter transistor in a smaller space than heretofore known. The structure further has the flexibility of permitting the emitter size to be altered without effecting the rest of the structure or other structures on the same monocrystalline substrate and also provides a lower capacitance improving overall circuit performance.

While the invention has been particularly shown and described with reference to a preferred embodiment thereof, it will be understood by those skilled in the art that various changes in form and details may be made therein without departing from the spirit and scope of the invention.

What is claimed is:

1. A semiconductor structure comprising:
  a substrate;
  an annular subcollector region formed by semiconductor material doped with an impurity of a first conductivity type in said substrate;
  at least one base region formed by semiconductor material doped with an impurity of a second conductivity type over at least a portion of said subcollector region and defining a base-collector PN junction;
  at least one emitter region formed by semiconductor material doped with an impurity of said first conductivity type substantially in said at least one base region and over said subcollector region and defining a base-emitter PN junction;
  said annular subcollector region laterally surrounding a region having a higher resistivity than said annular subcollector region, said region of higher resistivity comprising insulating material.

2. A semiconductor structure as in claim 1 wherein said region having a higher resistivity further comprises:
  semiconductor material doped with an impurity of said first conductivity type and having an impurity concentration lower than the impurity concentration of said annual subcollector region.

3. A semiconductor structure as in claim 2 wherein said region of higher resistivity extends to a major surface of said substrate and is adapted for the formation of at least one Schottky barrier diode.

4. A semiconductor structure as in claim 1 wherein said insulating material comprises:
  an oxide of silicon.

5. A semiconductor structure as in claim 4 wherein said oxide of silicon is silicon dioxide formed by in situ conversion of portions of said semiconductor material within the area defined by the outer periphery of said annular subcollector region.

6. A semiconductor structure as in claim 1 further comprising:
  an isolating material laterally surrounding said entire structure thereby isolating said structure from other portions of said substrate.

7. A semiconductor structure as in claim 6 wherein said isolating material comprises an oxide of silicon.

8. A semiconductor structure as in claim 1 wherein said annular subcollector region defines a polygon, said at least one base region being formed over each section of said polygon, an emitter region being formed in each said at least one base region over each section of said polygon.

9. A multiemitter integrated semiconductor transistor structure comprising:
  a semiconductor substrate having first and second major surfaces;
  an annular subcollector region formed with the semiconductor substrate by highly doping said semiconductor substrate material with an impurity of a first conductivity type;
  at least one base region formed by semiconductor material doped with an impurity of a second conductivity type over at least a portion of said subcollector region and defining a base-collector P-N junction;
  an emitter region formed substantially in the at least one base region over at least a portion of the subcollector region by a semiconductor material doped with an impurity of said first conductivity type and defining a base-emitter P-N junction;
  said annular subcollector region laterally surrounding a region having a higher resistivity than said annular subcollector region; and
  said region of higher resistivity comprising insulating material.

10. A semiconductor structure as in claim 7 wherein said oxide of silicon is silicon dioxide formed by in situ conversion of portions of said semiconductor material outside an area defined by the inner periphery of said annular subcollector region.

11. A semiconductor structure as in claim 7 wherein said isolating material comprises, at least in part, a doped isolation region under said oxide of silicon.

12. A multiemitter integrated semiconductor transistor structure as in claim 9 having an epitaxial layer over at least a portion of said substrate, said at least one base region, said base-collector P-N junction, said emitter region, and said base-emitter P-N junction being formed in said epitaxial layer.

13. A multiemitter integrated semiconductor transistor structure as in claim 9 wherein said region having a higher resistivity comprises:
 semiconductor material doped with an impurity of said first conductivity type and having an impurity concentration lower than the impurity concentration of said annular subcollector region.

14. A multiemitter integrated semiconductor transistor structure as in claim 13 wherein said region of higher resistivity extends to a major surface of said substrate and is adapted for the formation of at least one Schottky barrier diode.

15. A multiemitter integrated semiconductor transistor structure as in claim 9 wherein said insulating material comprises:
 an oxide of silicon.

16. A multiemitter integrated semiconductor transistor structure as in claim 15 wherein said oxide of silicon is silicon dioxide formed by in situ conversion of portions of said semiconductor material within an area defined by the outer periphery of said annular subcollector region.

17. A multiemitter integrated semiconductor transistor structure as in claim 9 further comprising:
 an isolating material laterally surrounding said entire structure thereby isolating said structure from other portions of said substrate.

18. A multiemitter integrated semiconductor transistor structure as in claim 17 wherein said isolating material comprises, an oxide of silicon.

19. A multiemitter integrated semiconductor transistor structure as in claim 18 wherein said oxide of silicon is silicon dioxide formed by in situ conversion of portions of said semiconductor material outside an area defined by the inner periphery of said subcollector region.

20. A multiemitter integrated semiconductor transistor structure as in claim 18 wherein said isolating material comprises, at least in part, a doped isolation region under said oxide of silicon.

21. A multiemitter integrated semiconductor transistor structure as in claim 9 wherein said annular subcollector region defines a polygon, said at least one base region formed over each section of said polygon, an emitter region being formed in each said at least one base region over each section of said polygon.

* * * * *